(12) United States Patent
Chindalore et al.

(10) Patent No.: US 7,745,870 B2
(45) Date of Patent: Jun. 29, 2010

(54) PROGRAMMING AND ERASING STRUCTURE FOR A FLOATING GATE MEMORY CELL AND METHOD OF MAKING

(75) Inventors: Gowrishankar L. Chindalore, Austin, TX (US); Craig T. Swift, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 19 days.

(21) Appl. No.: 11/626,681

(22) Filed: Jan. 24, 2007

(65) Prior Publication Data
US 2007/0117319 A1   May 24, 2007

Related U.S. Application Data

(62) Division of application No. 10/944,244, filed on Sep. 17, 2004, now Pat. No. 7,183,161.

(51) Int. Cl.
*H01L 29/76* (2006.01)
(52) U.S. Cl. .................. 257/314; 257/315; 257/316; 257/317; 257/318; 257/320; 257/321; 257/322; 257/323; 257/324; 257/E29.129; 257/E29.3
(58) Field of Classification Search ................ 257/314, 257/315–324, E29.129, E21.174, E21.422, 257/E29.3
See application file for complete search history.

(56) References Cited

U.S. PATENT DOCUMENTS

| 4,288,256 A | 9/1981 | Ning et al. |
| 5,413,949 A | 5/1995 | Hong |
| 5,741,719 A | 4/1998 | Kim |
| 5,923,976 A | 7/1999 | Kim |
| 6,153,472 A | 11/2000 | Ding et al. |
| 6,297,097 B1 | 10/2001 | Jeong |
| 6,300,196 B1 | 10/2001 | Chang |
| 6,323,088 B1 * | 11/2001 | Gonzalez et al. ............ 438/257 |

(Continued)

OTHER PUBLICATIONS

Kitamura et al; "A Low Voltage Operating Flash memory Cell with High Coupling Ratio Using Horned Floating Gate with Fine HSG"; IEEE 1998 Symposium on VLSI Techwology Digest of technical papers, pp. 104-105.

(Continued)

*Primary Examiner*—Cuong Q Nguyen
*Assistant Examiner*—Trang Q Tran
(74) *Attorney, Agent, or Firm*—James L. Clingan, Jr.; Joanna G. Chiu

(57) ABSTRACT

A floating gate memory cell has a floating gate in which there are two floating gate layers. The top layer is etched to provide a contour in the top layer while leaving the lower layer unchanged. The control gate follows the contour of the floating gate to increase capacitance therebetween. The two layers of the floating gate can be polysilicon separated by a very thin etch stop layer. This etch stop layer is thick enough to provide an etch stop during a polysilicon etch but preferably thin enough to be electrically transparent. Electrons are able to easily move between the two layers. Thus the etch of the top layer does not extend into the lower layer but the first and second layer have the electrical effect for the purposes of a floating gate of being a continuous conductive layer.

5 Claims, 16 Drawing Sheets

U.S. PATENT DOCUMENTS

| | | | |
|---|---|---|---|
| 6,342,715 B1 | 1/2002 | Shimizu et al. | |
| 6,391,722 B1 | 5/2002 | Koh | |
| 6,495,467 B2 | 12/2002 | Shin et al. | |
| 6,537,880 B1 | 3/2003 | Tseng | |
| 6,602,750 B2 | 8/2003 | Kao | |
| 6,627,942 B2 | 9/2003 | Wang | |
| 6,713,834 B2 | 3/2004 | Mori et al. | |
| 6,716,705 B1 | 4/2004 | Mehta et al. | |
| 6,780,712 B2 | 8/2004 | Hsieh | |
| 6,791,142 B2 | 9/2004 | Tseng | |
| 6,806,132 B2 | 10/2004 | Mori et al. | |
| 6,867,098 B2 | 3/2005 | Park et al. | |
| 6,897,116 B2 | 5/2005 | Lee et al. | |
| 6,908,817 B2 | 6/2005 | Yuan | |
| 6,943,118 B2 | 9/2005 | Chen et al. | |
| 7,449,745 B2 * | 11/2008 | Matsui et al. | 257/316 |
| 7,557,042 B2 | 7/2009 | Li et al. | |
| 2003/0057473 A1 * | 3/2003 | Kamiya et al. | 257/314 |
| 2004/0057264 A1 | 3/2004 | Houdt et al. | |
| 2004/0229422 A1 | 11/2004 | Mori et al. | |

OTHER PUBLICATIONS

International Search Report and Written Opinion mailed Jun. 19, 2008 in Corresponding PCT Application PCT/US05/28828.
Restriction Requirement mailed Sep. 30, 2005 in Parent U.S. Appl. No. 10/944244.
Office Action mailed Nov. 25, 2005 in Parent U.S. Appl. No. 10/944244.
Notice of Allowance mailed Nov. 3, 2006 in Parent U.S. Appl. No. 10/944244.
Restriction Requirement mailed Sep. 30, 2005 in Related U.S. Appl. No. 10/9442339.
Office Action mailed Nov. 11, 2004 in Related U.S. Appl. No. 10/9442339.
Notice of Allowance mailed Apr. 10, 2006 in Related Appl. No. 10/9442339.

* cited by examiner

PROGRAMMING AND ERASING STRUCTURE FOR A FLOATING GATE MEMORY CELL AND METHOD OF MAKING

RELATED APPLICATIONS

Patent application Ser. No. 10/944,239, titled "Programming and Erasing Structure for a Floating Gate Memory Cell and Method of Making," assigned to the assignee hereof, and filed concurrently herewith.

FIELD OF THE INVENTION

This invention relates to semiconductor devices, and more particularly, to semiconductor device structures useful for floating gate memory cells.

RELATED ART

One of the desirable characteristics of a floating gate memory is to have a relatively large amount of capacitive coupling between the control gate and the floating gate. This results in more voltage transfer to the floating gate from the control gate during program and erase for a given control gate bias. Thus more floating gate to control gate capacitance results in requiring lower voltages for achieving program and erase and/or improving the speed of programming and erase. Another desirable characteristic is to have low variation in this floating gate to control gate capacitance. If this capacitance varies then the range of threshold voltage increases for the erased state. A wider distribution of erased threshold voltages can result in difficulty in reading erased bits and programming erased bits due to leakage. One technique for increasing the control gate to floating gate capacitance while minimizing its variation uses an etch into the floating gate over the isolation region. This does provide some increase in capacitance, but further improvement would still be desirable. A disadvantage of this approach is that it is difficult to scale as the technology scales to smaller dimensions.

Thus, there is a need for device structures that improve programming and erasing and/or reduce voltages for programming and erasing.

BRIEF DESCRIPTION OF THE DRAWINGS

The present invention is illustrated by way of example and not limited by the accompanying figure, in which like references indicate similar elements, and in which.

Skilled artisans appreciate that elements in the figure are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a floating gate memory cell has a floating gate in which there are two floating gate layers. The top layer is etched to provide a contour in the top layer while leaving the lower layer unchanged. The control gate follows the contour of the floating gate to increase capacitance between the control gate and the floating gate. The two layers of the floating gate can be polysilicon separated by a very thin etch stop layer. This etch stop layer is thick enough to provide an etch stop during a polysilicon etch but thin enough to be electrically coupled. Because the etch stop layer is thin, electrons are able to move between the two layers. Thus the etch of the top layer does not extend into the lower layer but the first and second layer have the electrical effect for the purposes of a floating gate of being a continuous conductive layer. This is better understood by reference to the FIGs. and the following description.

Figure 1:
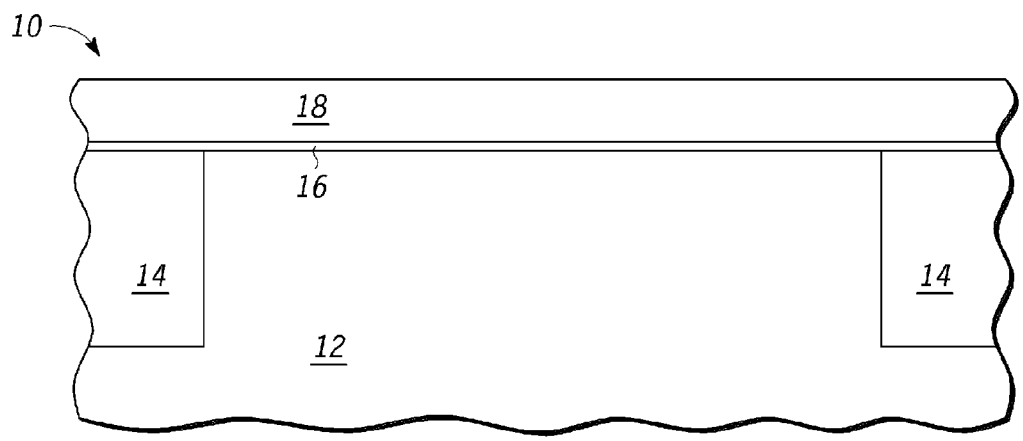
FIG. 1 is a cross section of a device structure at a stage in processing useful in producing the device structure according to a first embodiment of invention.

Shown in FIG. 1 is a device structure 10 comprising a substrate 12, an isolation region 14, a tunnel dielectric 16, and a floating gate layer 18, preferably of polysilicon. This is a conventional structure except the relative thickness of floating gate layer 18 is less than for a conventional floating gate layer of polysilicon. The thickness in this example is preferably about 500 Angstroms, which is less than for a conventional floating gate layer. Substrate 12 is preferably a bulk silicon substrate but could be an SOI substrate and/or a different semiconductor material than just silicon. Isolation region 14 is made using the common technique of forming a trench and filling it with a dielectric, preferably oxide, but could be another dielectric material such as nitride.

Figure 2:
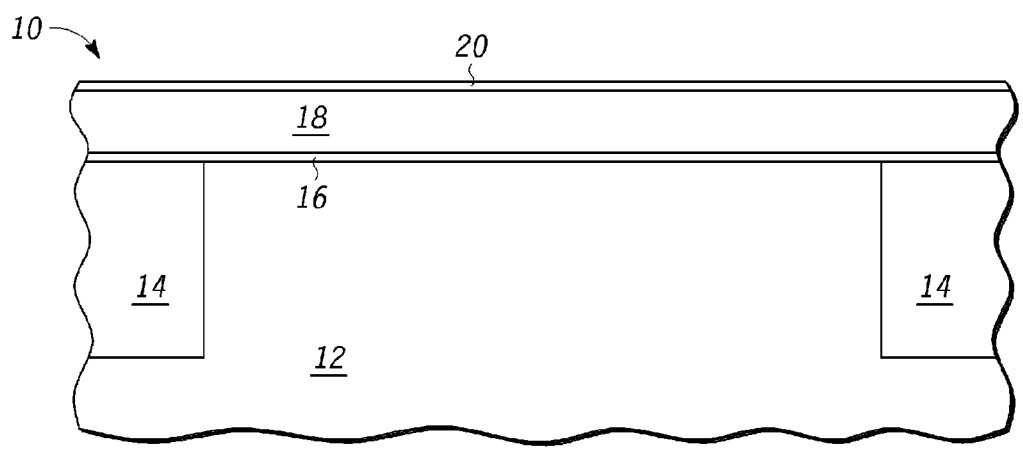
FIG. 2 is a cross section of the device structure of FIG. 1 at a stage in processing subsequent to that shown in FIG. 1.

Shown in FIG. 2 is device structure 10 after formation of an etch stop layer 20, which is preferably oxide, on floating gate layer 18. Layer 20 is preferably about 15 Angstroms of grown oxide. Layer 20 can also be deposited and can be another material, for example nitride.

Figure 3:
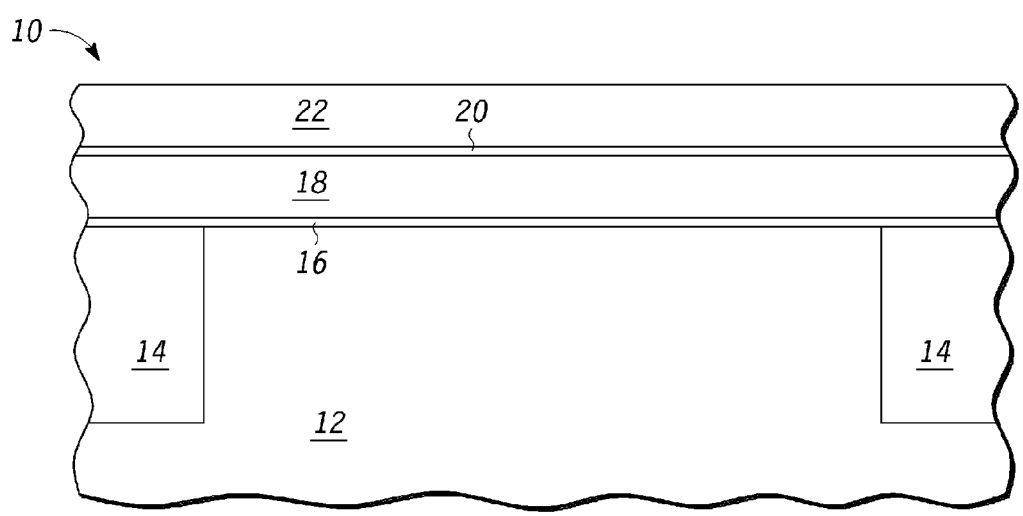
FIG. 3 is a cross section of the device structure of FIG. 2 at a stage in processing subsequent to that shown in FIG. 2.

Shown in FIG. 3 is device structure 10 after formation of a floating gate layer 22 preferably of silicon. This is preferably about the same thickness as floating gate layer 18.

Figure 4:
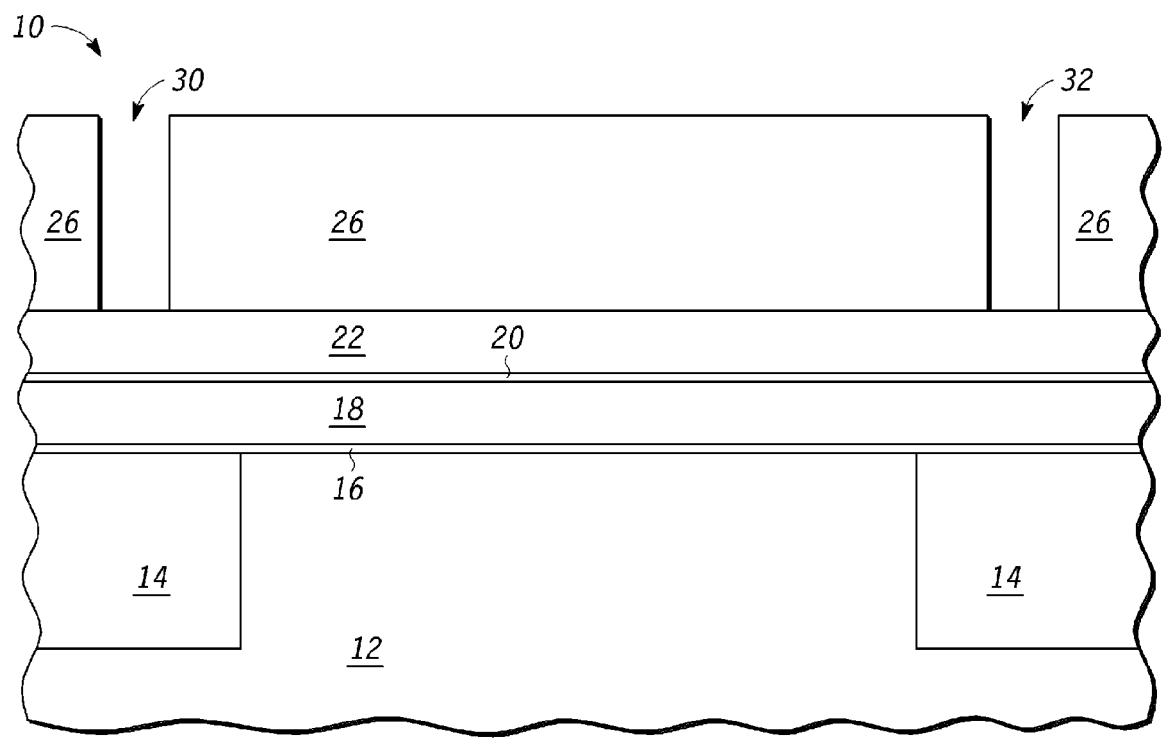
FIG. 4 is a cross section of the device structure of FIG. 3 at a stage in processing subsequent to that shown in FIG. 3.

Shown in FIG. 4 is device structure 10 after formation of a patterned photoresist layer 26 that has openings 30 and 32 over isolation region 14. These openings 30 and 32 are on opposing sides of isolation region 14.

Figure 5:
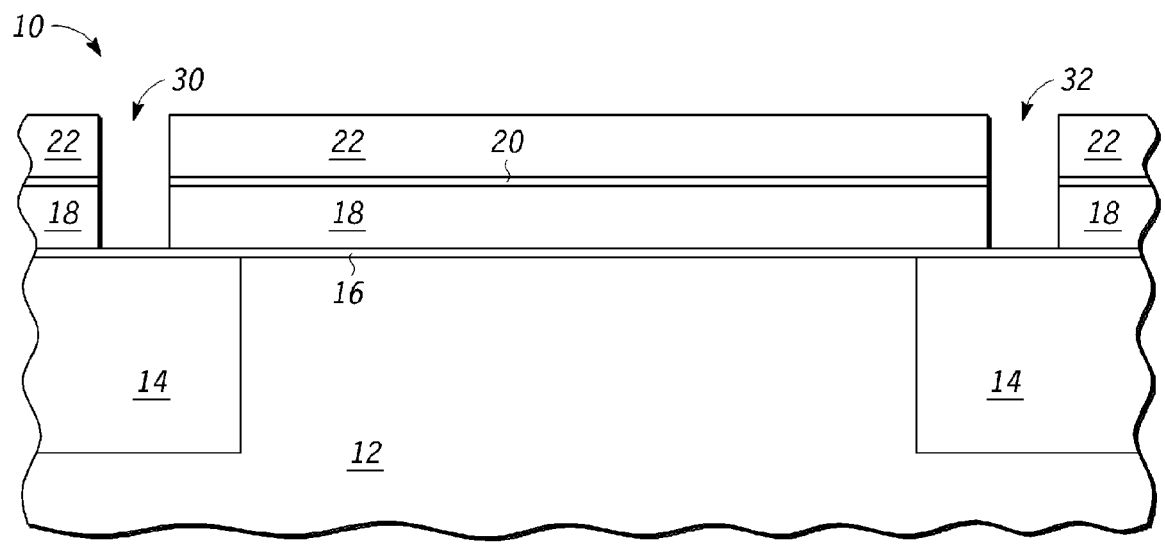
FIG. 5 is a cross section of the device structure of FIG. 4 at a stage in processing subsequent to that shown in FIG. 4.

Shown in FIG. 5 is device structure 10 after an etch of layers 22, 20, and 18 through openings 30 and 32. This etch is first through layer 22 that is preferably polysilicon. A chemistry change then etches through layer 20. Then the etch chemistry is switched back to that used for etching through layer 22. This extends openings 30 and 32 through floating gate layers 18 and 22 and etch stop layer 20.

Figure 6:
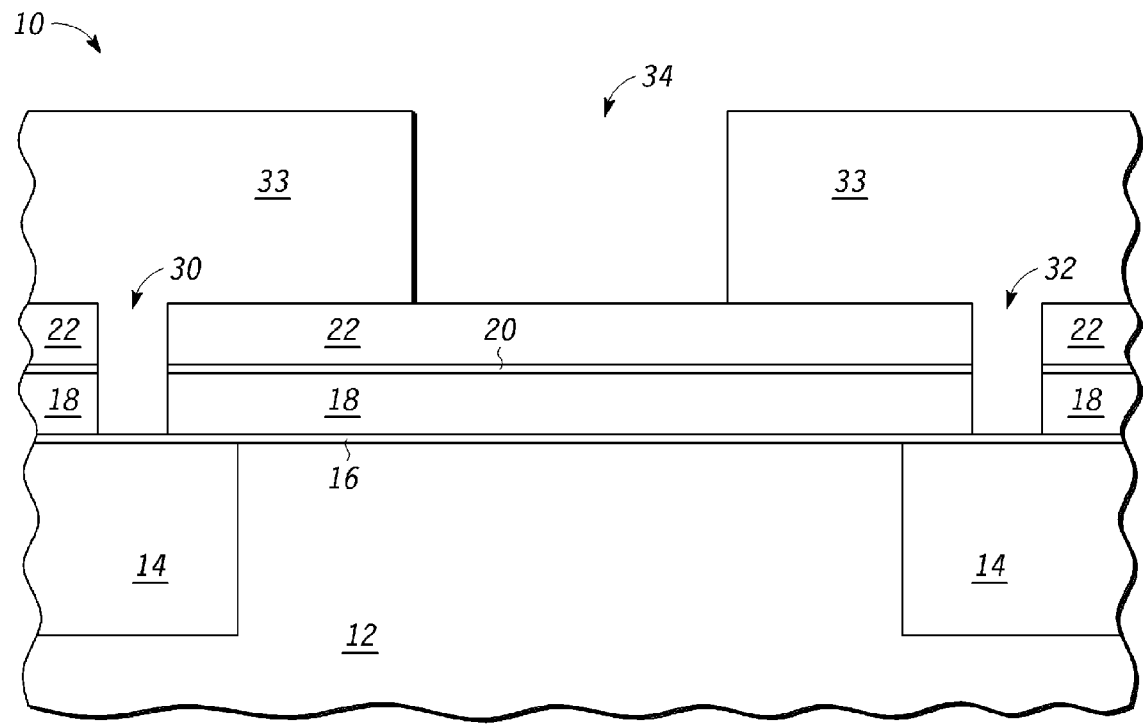
FIG. 6 is a cross section of the device structure of FIG. 5 at a stage in processing subsequent to that shown in FIG. 5.

Shown in FIG. 6 is device structure 10 after formation of a patterned photoresist layer 33 having an opening 34 between openings 30 and 32. Opening 34 is substantially centered between isolation regions 14 in this cross sectional view.

Figure 7:
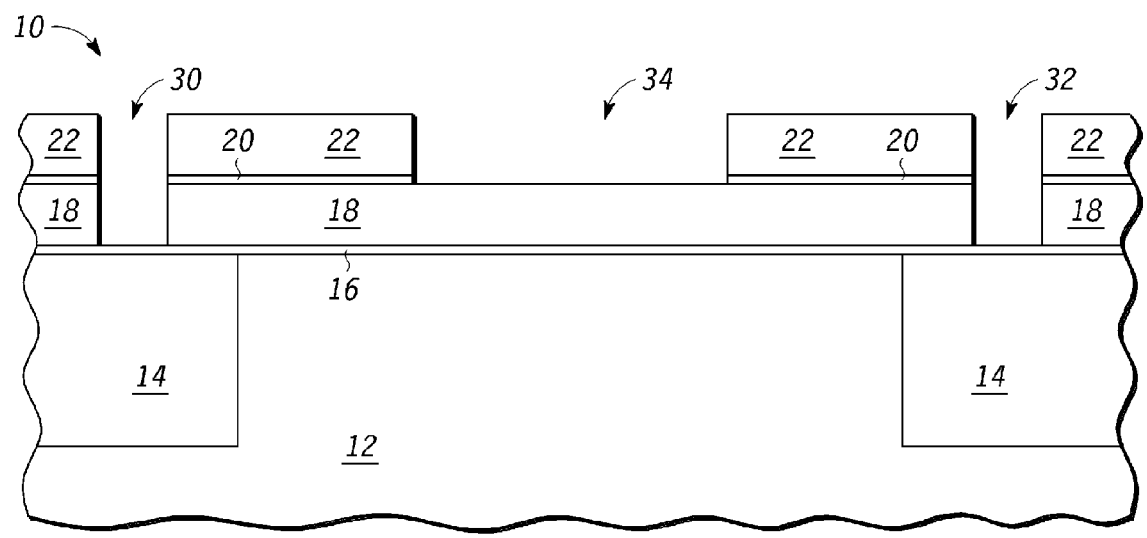
FIG. 7 is a cross section of the device structure of FIG. 6 at a stage in processing subsequent to that shown in FIG. 6.

Shown in FIG. 7 is device structure 10 after an etch through opening 34 through layer 22 that stops on layer 20. A change in etch chemistry results in opening 34 extending also through layer 20. If it is desirable to define opening 34 as a sublithographic feature, then instead of using patterned photoresist 33, a hard mask of, for example, nitride could be patterned and then have the opening partially filled with a sidewall spacer. The technique of partially filling an opening with sidewall spacers to make the opening smaller is well understood in the art.

Figure 8:
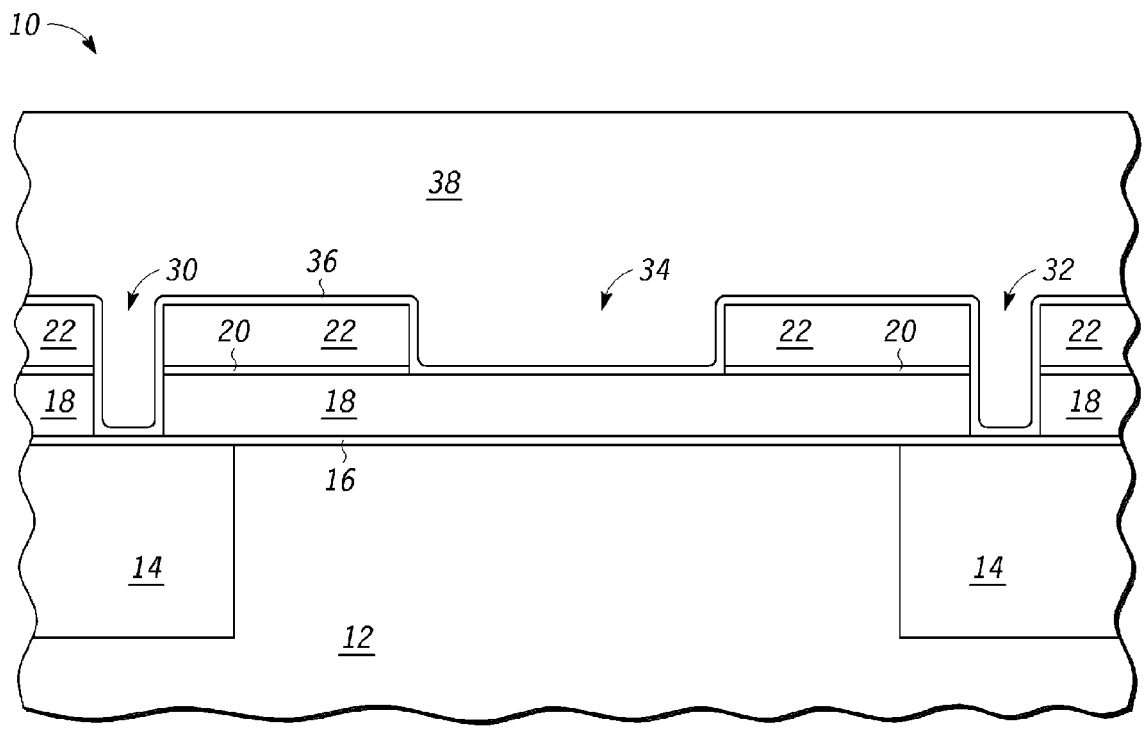
FIG. 8 is a cross section of the device structure of FIG. 7 at a stage in processing subsequent to that shown in FIG. 7.

Shown in FIG. 8 is device structure 10 after formation of a dielectric layer 36 and a control gate layer 38. Dielectric layer 36 is preferably a conventional three layer dielectric oxide-nitride-oxide layer that is about 125 to 150 Angstroms in thickness. Dielectric layer 36 functions as an interlevel dielectric between the control gate and the floating gate of the floating gage memory cell. Control gate 38 is preferably a polysilicon layer that is about 1000 to 2000 Angstroms thick. After formation of this control gate layer 38, it is etched to form an actual control gate. This etch to form an actual control gate does not change the cross section shown in this FIG. 8. Thus, the resulting structure of FIG. 8 is the final structure of a floating transistor useful as a floating gate memory cell that is also a non-volatile memory cell.

This device structure shows that control gate 38 has an increase in the surface area adjacent to floating gate layer 22 in opening 34 while retaining the surface area adjoining floating gate layers 18 and 22 in openings 30 and 32. The sidewalls of this remaining portion of layer 22 provide for not only increased capacitance but also very repeatable increased capacitance. The thickness of layer 22 is relatively easy to control. Layer 20 is very thin so that electrons pass across that structure quite easily. This oxide is not of the same quality as an oxide that is used as a gate dielectric so the electrons are not blocked, especially at the programming and erasing voltages that are commonly used. Even oxides of the highest quality have leakage at 15 Angstroms. Thus with the higher voltages than are used in transistors having the thin gate oxides there is substantial electron flow through the oxide. Thus, the electrons that are accumulated in floating gate layer 22 during a programming operation can freely reach floating gate layer 18 and for these purposes, layer 20 can be considered electrically transparent. As a further enhancement, more than one opening such as opening 34 can be performed in the process between FIG. 5 and FIG. 6. More openings such as opening 34 are beneficial because that would further increase the control gate to floating gate layer capacitance.

Figure 9:
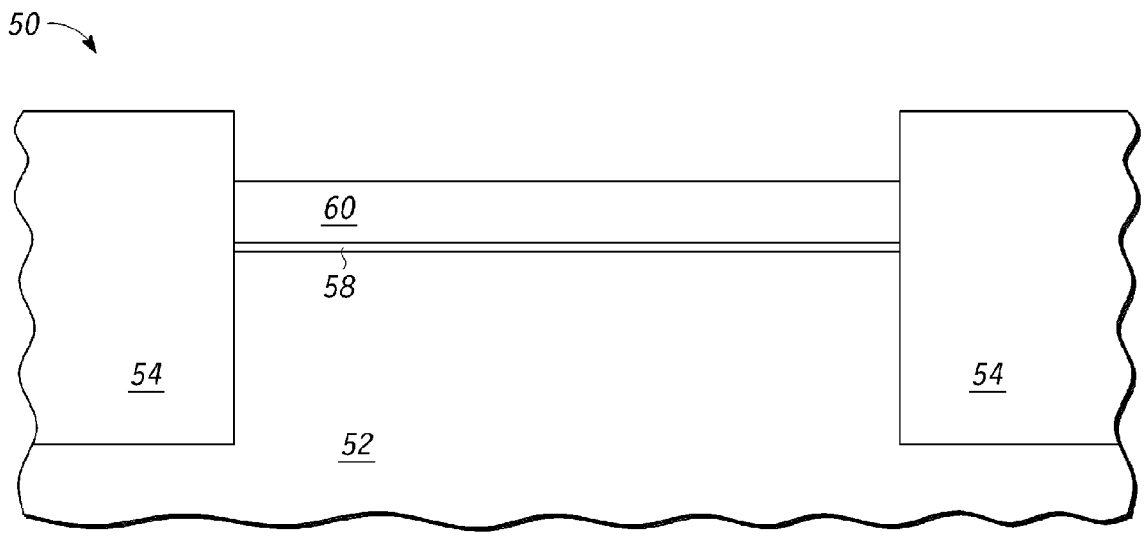
FIG. 9 is a cross section of a device structure as a second embodiment of the invention at a stage in processing.

Shown in FIG. 9 is a device structure 50 comprising a substrate 52 analogous to that of substrate 12, a trench 54 analogous to trench 14, a tunnel dielectric 58 analogous to that of tunnel dielectric 16, and a floating gate layer 60 analogous to floating gate layer 18 on tunnel dielectric 58. FIG. 9 depicts a conventional structure except that floating gate layer 60 is not as thick as for the conventional structures. Floating gate layer 60 is preferably about 500 Angstroms in thickness. In device structure 50, isolation region 54 surrounds and extends above floating gate layer 60.

Figure 10:
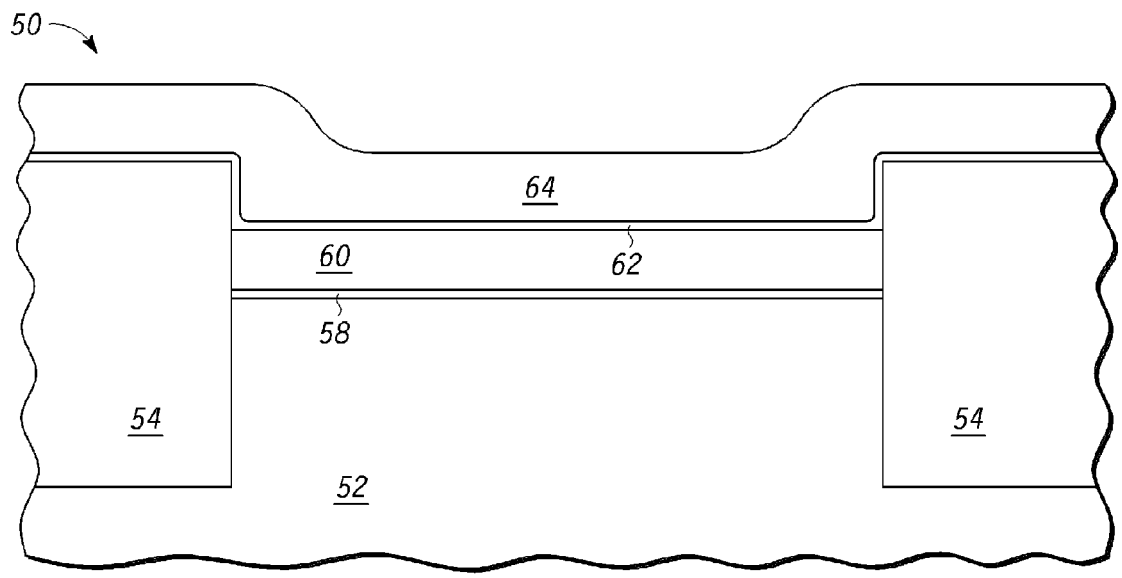
FIG. 10 is a cross section of the device structure of FIG. 9 at a stage in processing subsequent to that shown in FIG. 9.

Shown in FIG. 10 is device structure 50 after formation of etch stop layer 62 analogous to etch stop layer 20 on floating gate layer 60 and floating gate layer 64 analogous to floating gate layer 22 on etch stop layer 62. Etch stop layer 62 is shown on the sidewall of isolation region 54 and extending over isolation region 54. When grown as an oxide, etch stop layer is unlikely to be visible on trench 54 but is shown for the case where etch stop layer 62 is deposited, such as deposited nitride.

Figure 11:
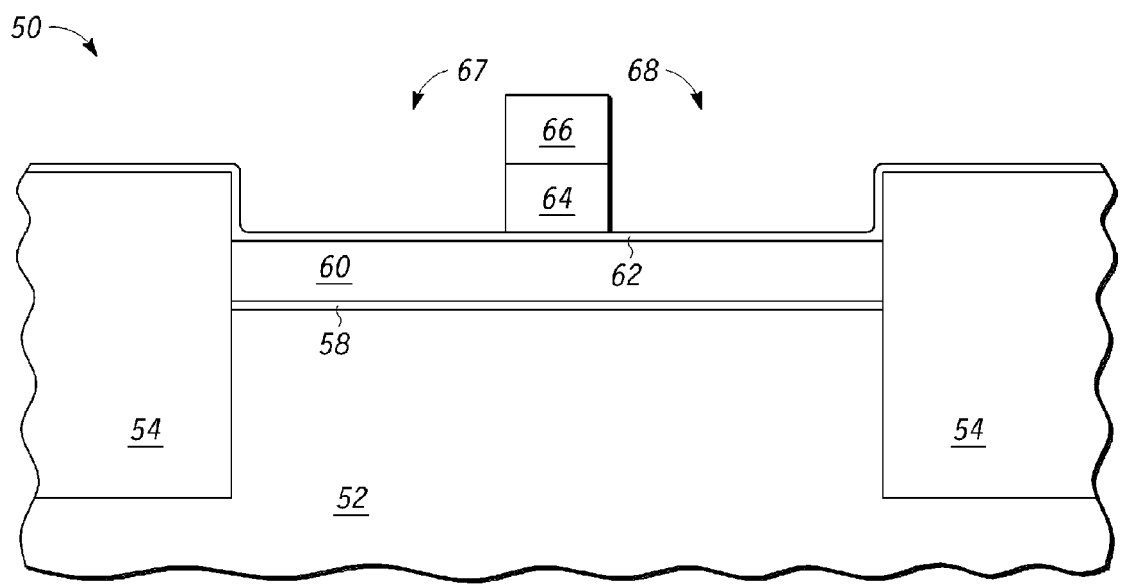
FIG. 11 is a cross section of the device structure of FIG. 10 at a stage in processing subsequent to that shown in FIG. 10.

Shown in FIG. 11 is device structure 50 after formation of patterned photoresist portion 66 and an etch of floating gate layer 64 using patterned photoresist portion 66 as a mask. This leaves openings 67 and 68 between the remaining portion of floating gate layer 64 and trench 54. In the process from FIG. 10 to FIG. 11, all of layer 64 is removed except that protected by photoresist 66.

Figure 12:
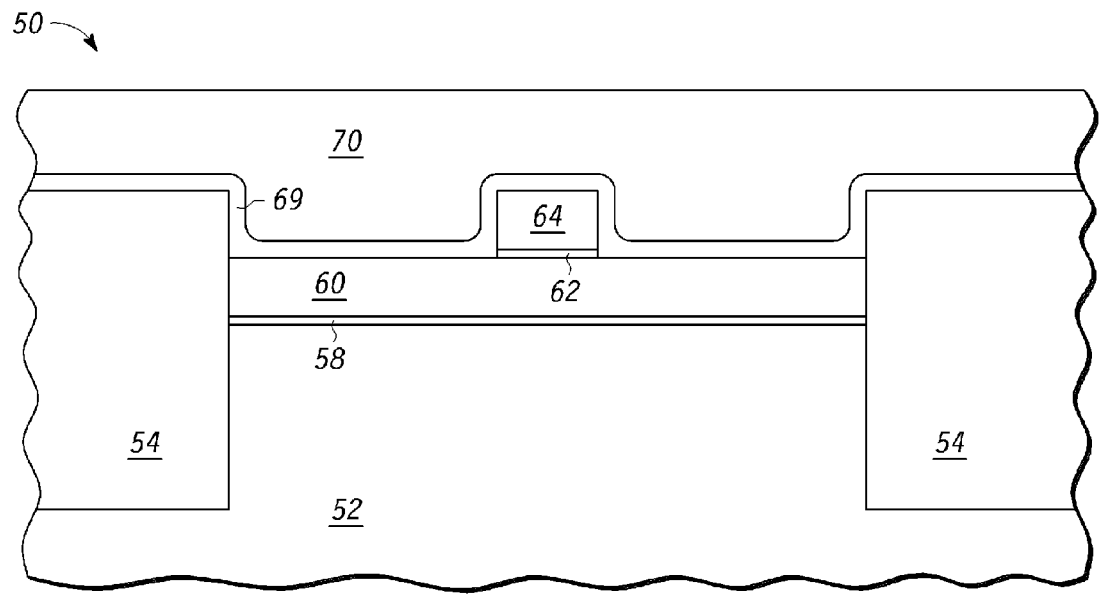
FIG. 12 is a cross section of the device structure of FIG. 11 at a stage in processing subsequent to that shown in FIG. 11.

Shown in FIG. 12 is device structure 50 after removal of the portion of etch stop layer 62 not under patterned photoresist portion 66, removal of patterned photoresist portion 66, formation of dielectric layer 69 analogous to layer 36 on floating gate layer 60, over the remaining portion of layer 64, and on the exposed portion of trench 54, and formation of control gate layer 70 analogous to control gate layer 38 on dielectric layer 69. A subsequent etch through layers 70, 69, 64, 62, and 60 result in the formation of a floating gate memory cell structure analogous to that for the structure of FIG. 8. Thus, the device structure of FIG. 12 is the resulting device structure for the memory cell. This shows that control gate layer 70 has increased surface adjacent to floating gate layer 64 due to the etch of layer 64 prior to the formation of control gate layer 70. The sidewalls of this remaining portion of layer 64 provide for not only increased capacitance but also very repeatable increased capacitance. The thickness of layer 64 is relatively easy to control.

Figure 13:
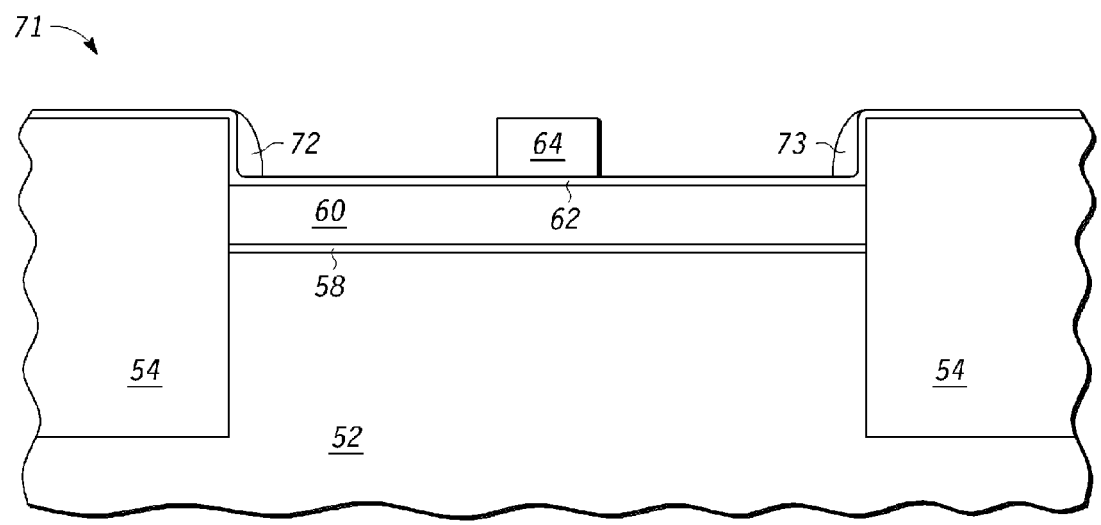
FIG. 13 is a cross section of the device structure of FIG. 10 at a stage in processing subsequent to that shown in FIG. 10 and as a third embodiment of the invention.

Shown in FIG. 13 is an alternative device structure 71 formed after FIG. 10 to that of device structure 50 of FIG. 11. Device structure 71 differs from device structure 50 of FIG. 11 by formation of sidewall spacers 72 and 73 from floating gate layer 64 on the sidewalls of isolation region 54 by performing an anisotropic etch on floating gate layer 64 of FIG. 10. Sidewall spacers 72 and 73 are formed inherently during the etch of layer 64. In the case of device structure 71 of FIG. 13, this etch of layer 64 is stopped after the etch has reached layer 62 but before these sidewall spacers 72 and 73 have been removed. In the case of device structure 50 of FIG. 11, this etch continues so that the sidewall spacers are removed.

Figure 14:
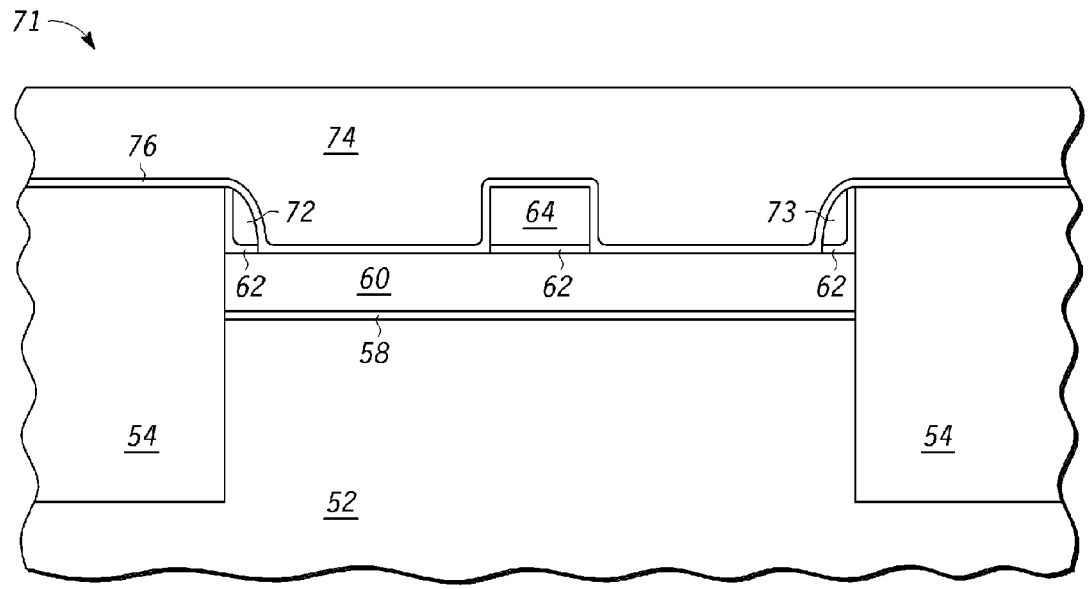
FIG. 14 is a cross section of the device structure of FIG. 13 at a stage in processing subsequent to that shown in FIG. 13.

Shown in FIG. 14 is a device structure 71 after formation of dielectric layer 76 analogous to dielectric layer 36 on sidewall spacers 72 and 73 and the remaining portion of floating gate layer 64 and control gate layer 74 analogous to control gate layer 38 on dielectric layer 76. In this cross sectional view FIG. 14 shows a completed memory device. In this case, sidewall spacers 72 and 74 become part of the floating gate layer of the memory device. These sidewall spacers have a larger vertical dimension than a horizontal dimension so that their presence provides the benefit of an increase in control gate to floating gate layer capacitance. A potential disadvantage is the difficulty in controlling the vertical dimension of these sidewall spacers so that there may be an increase in the variation in the control gate to floating gate layer capacitance.

Figure 15:
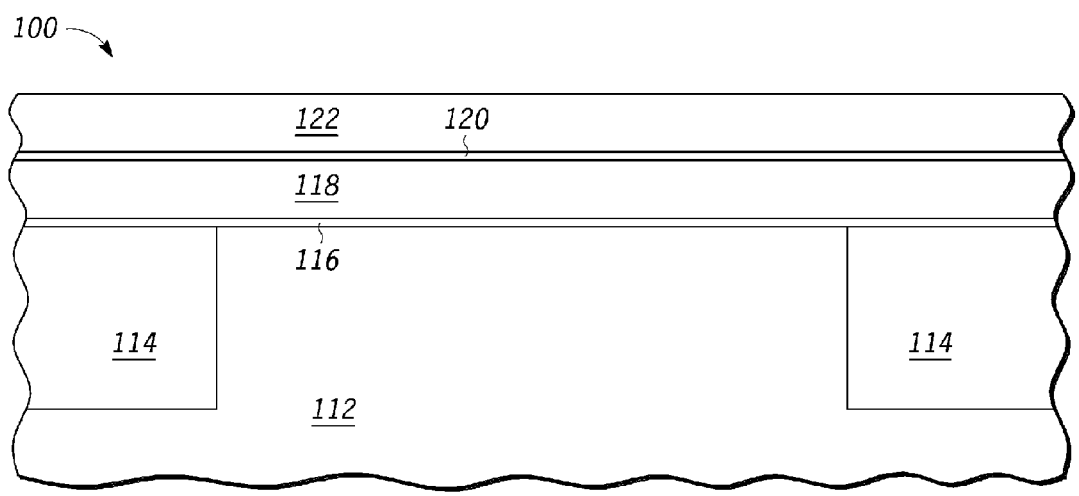
FIG. 15 is a cross section of a device structure as a fourth embodiment of the invention at a stage in processing.

Shown in FIG. 15 is a device structure 100 comprising a substrate 112 analogous to substrate 12, an isolation region 114 analogous to isolation region 114, a gate dielectric layer 116 analogous to gate dielectric layer 16, a floating gate layer 118 analogous to floating gate layer 18, a thin etch stop layer 120 analogous to etch stop layer 20, and a sacrificial layer 122 on etch stop layer 20. Sacrificial layer 122 may be oxide or nitride or other material but is of a material than can be etched selective to that of etch stop layer 120. Sacrificial layer is in this example about the same thickness as floating gate layer 118. Other thicknesses may also be effective.

Figure 16:
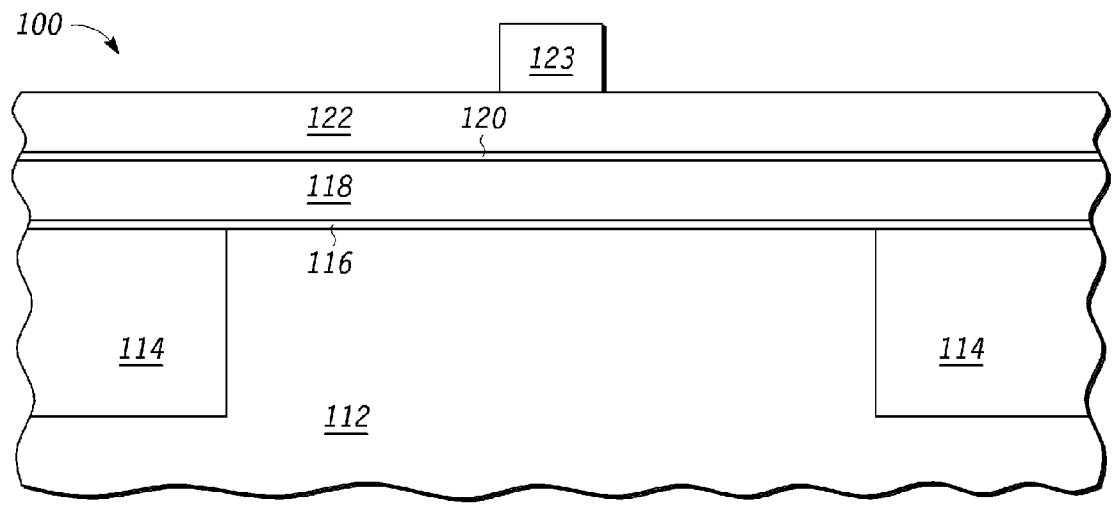
FIG. 16 is a cross section of the device structure of FIG. 15 at a stage in processing subsequent to that shown in FIG. 15.

Shown in FIG. 16 is device structure 100 after formation of a patterned photoresist portion 123 over sacrificial layer 122 and substantially centered, in the dimension shown, between isolation regions 114.

Figure 17:
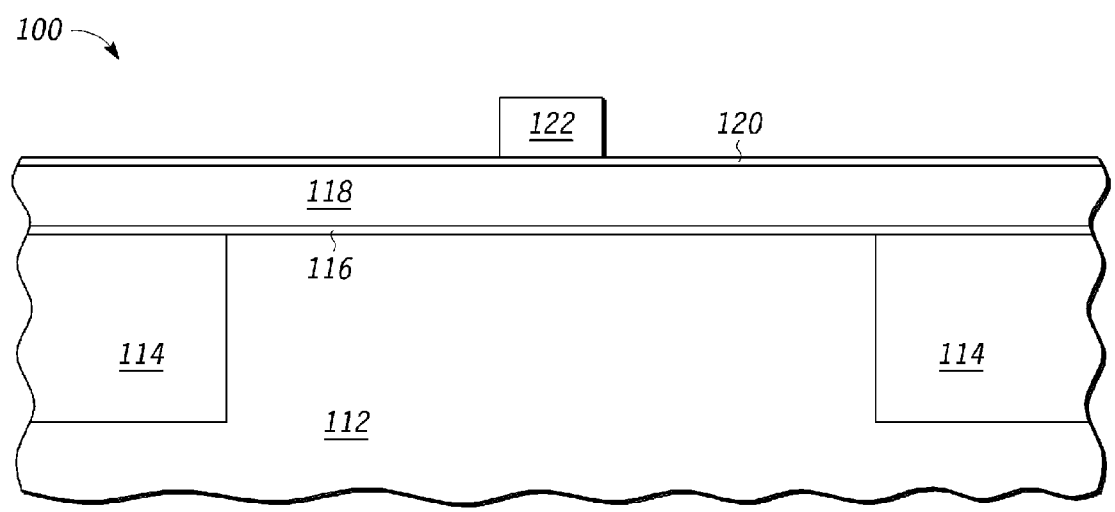
FIG. 17 is a cross section of the device structure of FIG. 16 at a stage in processing subsequent to that shown in FIG. 16.

Shown in FIG. 17 is device structure 100 after etching sacrificial layer 122 using patterned photoresist portion 123 as a mask. This etch is stopped by etch stop layer 120.

Figure 18:
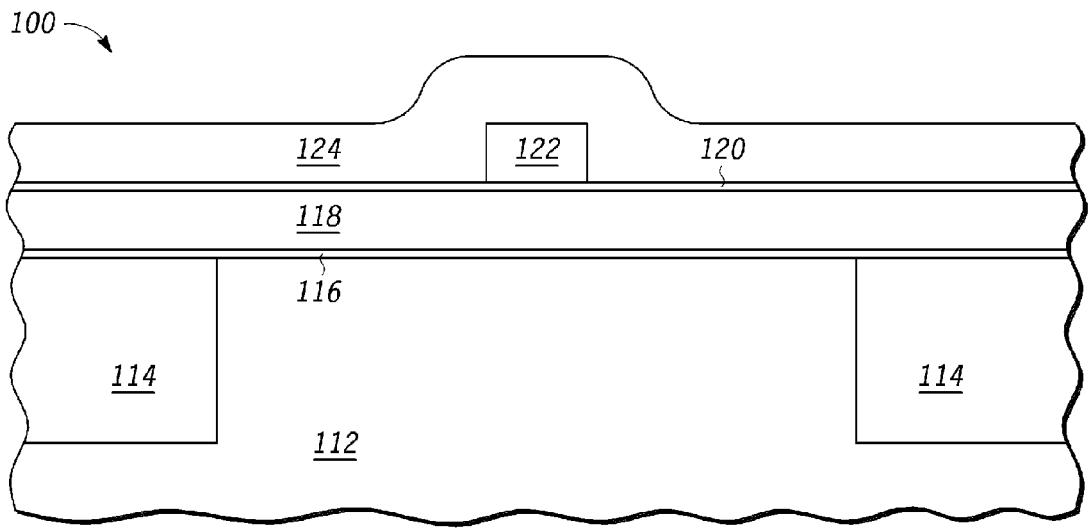
FIG. 18 is a cross section of the device structure of FIG. 17 at a stage in processing subsequent to that shown in FIG. 17.

Shown in FIG. 18 is a device structure 100 after removal of photoresist portion 124 and formation of a floating gate layer 124 that is preferably polysilicon, which is conformal. Floating gate layer 124 is about the same thickness as floating gate layer 118.

Figure 19:
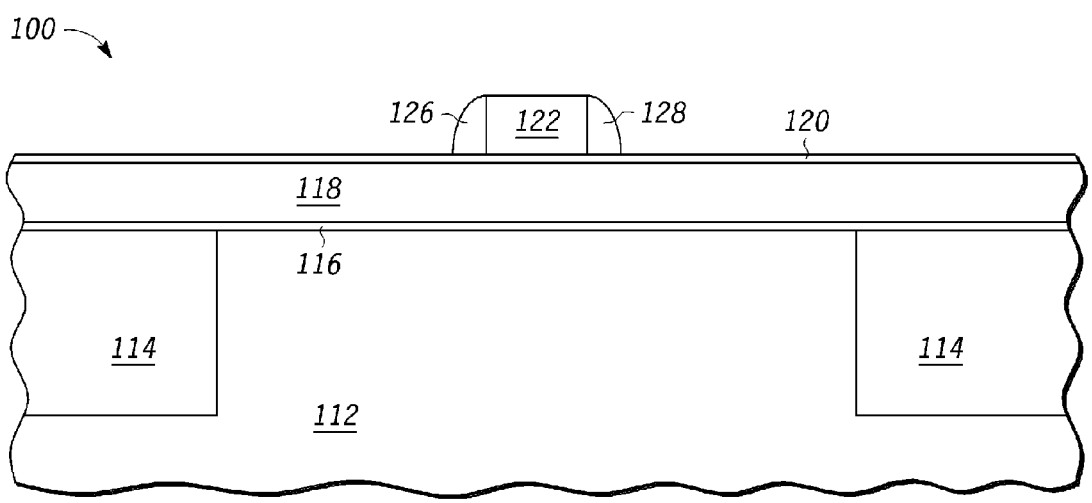
FIG. 19 is a cross section of the device structure of FIG. 18 at a stage in processing subsequent to that shown in FIG. 18.

Shown in FIG. 19 is device structure 100 after an anisotropic etch that forms sidewall spacers 126 and 128 from floating gate layer 124 on sidewalls of the remaining portion of sacrificial layer 122.

Figure 20:
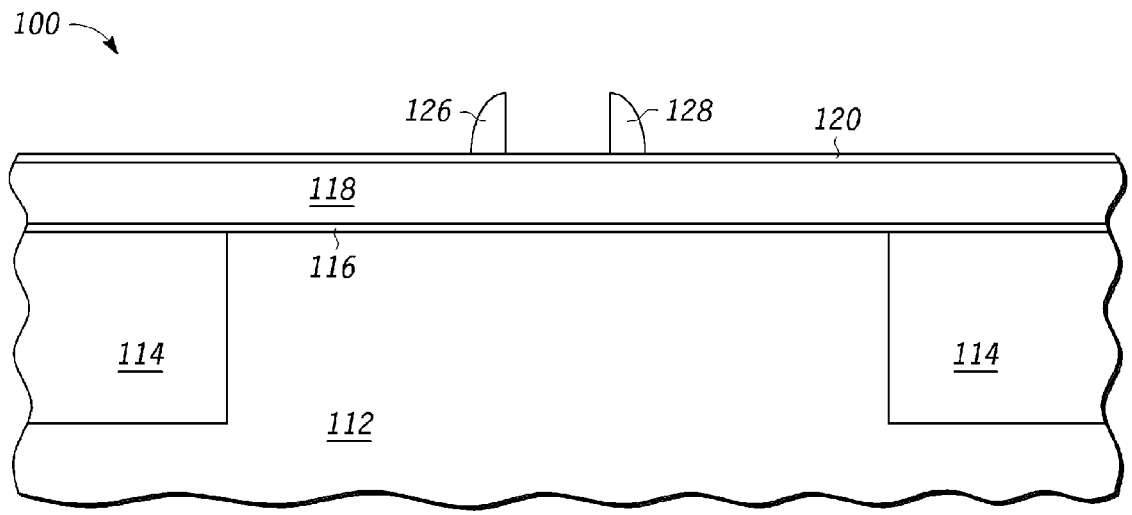
FIG. 20 is a cross section of the device structure of FIG. 19 at a stage in processing subsequent to that shown in FIG. 19.

Shown in FIG. 20 is device structure 100 after removal of the remaining portion of sacrificial layer 122 so that sidewall spacers 126 and 128 are free standing on etch stop layer 120. The width of sidewall spacers 126 and 128 are largely determined by the thickness of floating gate layer 124, which can be altered as desired. Floating gate layer 124 should be thick enough so that sidewall spacers 126 and 128 can be repeatedly free standing.

Figure 21:
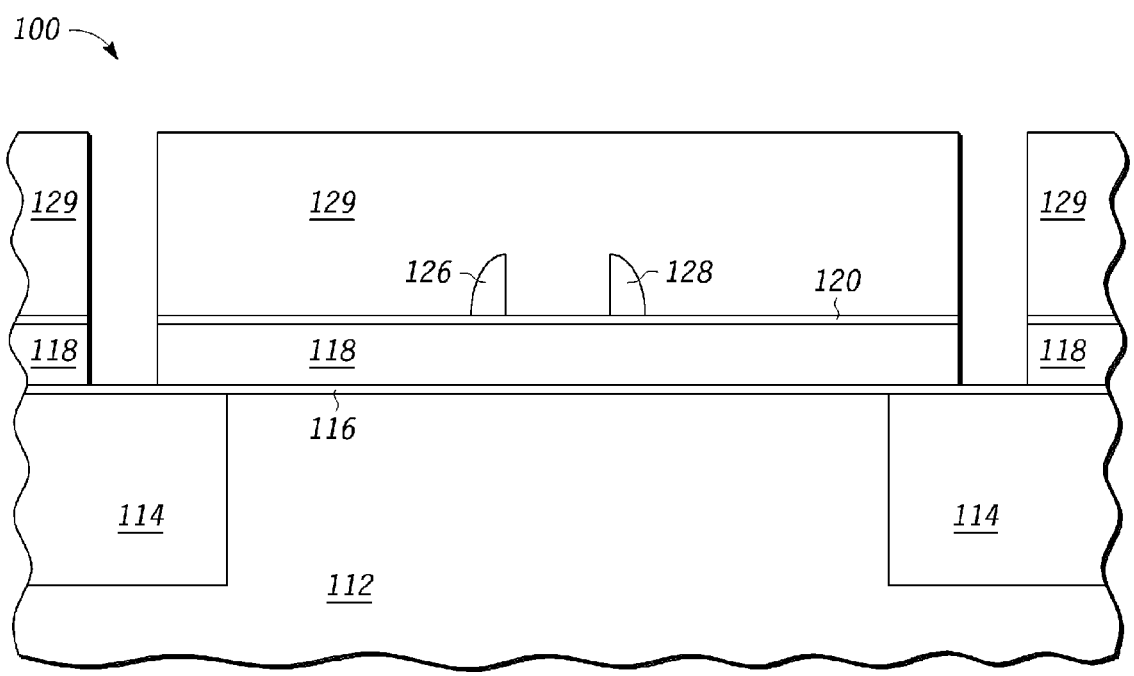
FIG. 21 is a cross section of the device structure of FIG. 20 at a stage in processing subsequent to that shown in FIG. 20.

Shown in FIG. 21 is device structure 100 after formation of a patterned photoresist layer that 129 that is opened over isolation regions 114 and an etch through etch stop layer 120, and floating gate layer 118.

Figure 22:
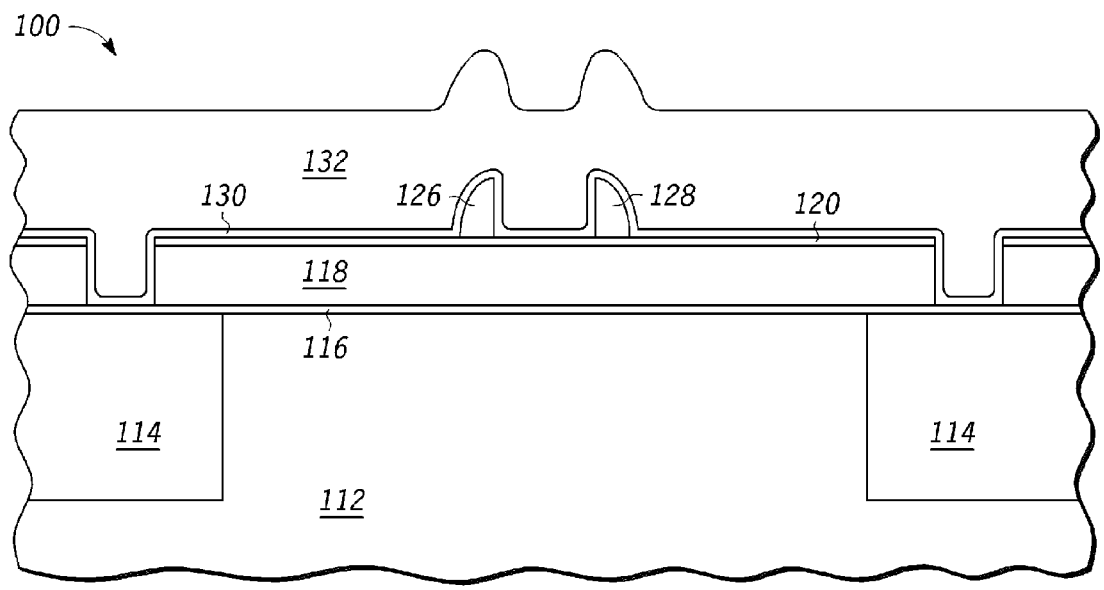
FIG. 22 is a cross section of the device structure of FIG. 21 at a stage in processing subsequent to that shown in FIG. 21.

Shown in FIG. 22 is device structure 100 after removal of patterned photoresist layer 129, the formation of a dielectric layer 130 analogous to dielectric layer 36 over etch stop layer 120 and in the openings over the isolation region 114, and the formation of control gate layer 132 analogous to control layer 38 over dielectric layer 130. This cross section of FIG. 22 depicts a completed floating gate memory cell structure. Sidewall spacers 126 and 128, which form part of the floating gate material of the memory cell, thus provide a structure for increasing the control gate to floating gate layer capacitance while also retaining the increased capacitance along the sidewalls of the floating gate layer in the area over the isolation region. If lithographic capability allows, additional sidewall spacers similar to sidewall spacers 126 and 128 can be formed by leaving more than one portion of floating gate layer 123 on etch stop layer 120 between isolation regions 114.

Figure 23:
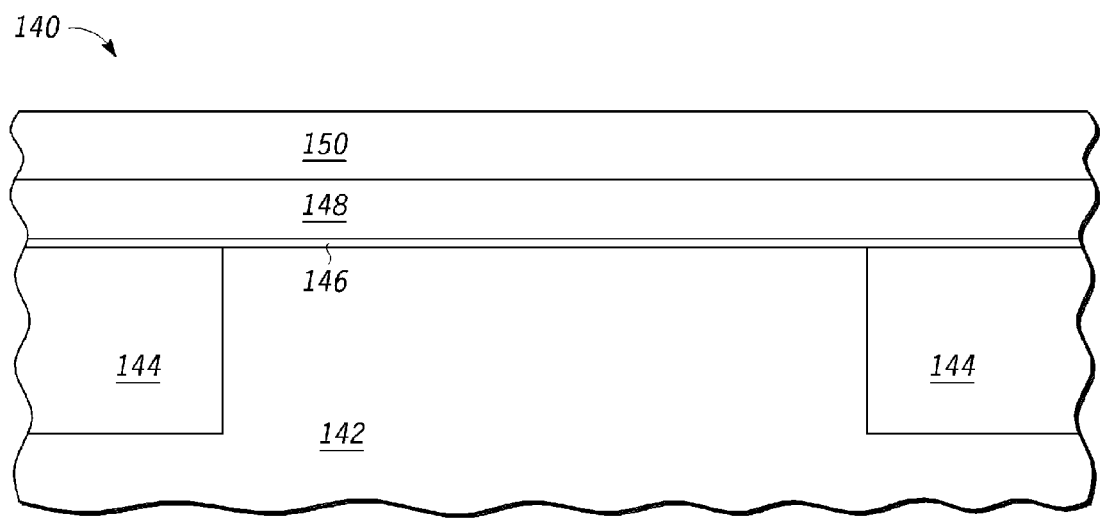
FIG. 23 is a cross section of a device structure as a fifth embodiment of the invention at a stage in processing.

Shown in FIG. 23 is a device structure 140 having a substrate 142 analogous to substrate 12, an isolation region 144 analogous to isolation region 14, a gate dielectric layer 146 analogous to gate dielectric layer 16, a floating gate layer 148 analogous to floating gate layer 18, and a sacrificial layer 150 on floating gate layer 148. Sacrificial layer 150 is preferably oxide but could be another material such as nitride. Sacrificial layer 150 is may be etched selective to floating gate layer 148. In the preferred case of floating gate layer 148 being polysilicon, either oxide or nitride are effective as sacrificial layer 150. Sacrificial layer is preferably about the same thickness as floating gate layer 148.

Figure 24:
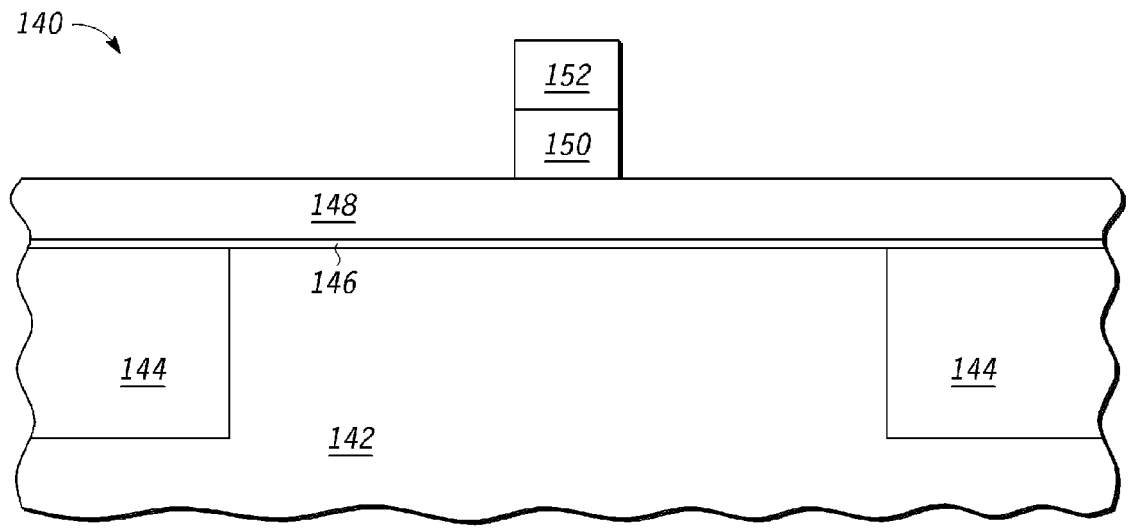
FIG. 24 is a cross section of the device structure of FIG. 23 at a stage in processing subsequent to that shown in FIG. 23.

Shown in FIG. 24 is device structure 140 after formation of a patterned photoresist portion 152 and an etch through sacrificial layer 150 using patterned photoresist portion 152 as a mask to leave a portion of sacrificial layer 150 between isolation regions 144. The remaining portion of sacrificial layer 150 is substantially between inside isolation regions 144 in the dimension shown in the cross section of FIG. 24

Figure 25:
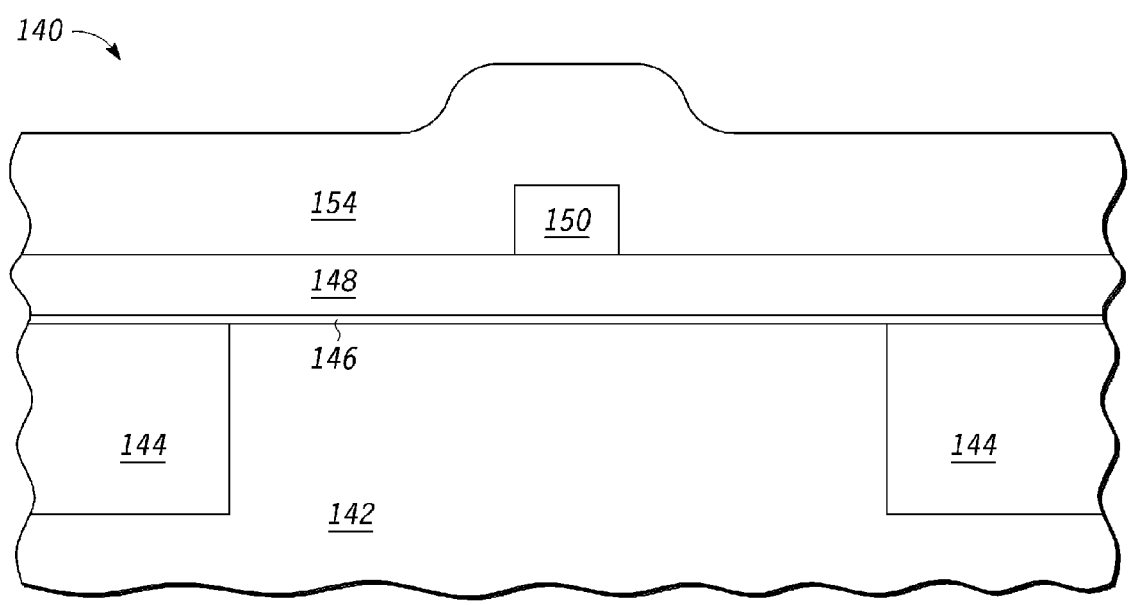
FIG. 25 is a cross section of the device structure of FIG. 24 at a stage in processing subsequent to that shown in FIG. 24.

Shown in FIG. 25 is device structure 140 after removal of patterned photoresist portion 152 and formation of a floating gate layer 154 over floating gate layer 148 and the remaining portion of sacrificial layer 150. In the preferred case of floating gate layer 154 being polysilicon, floating gate layer 154 is conformal so that the portion of floating gate layer 154 is higher over the remaining portion of sacrificial layer 150.

Figure 26:
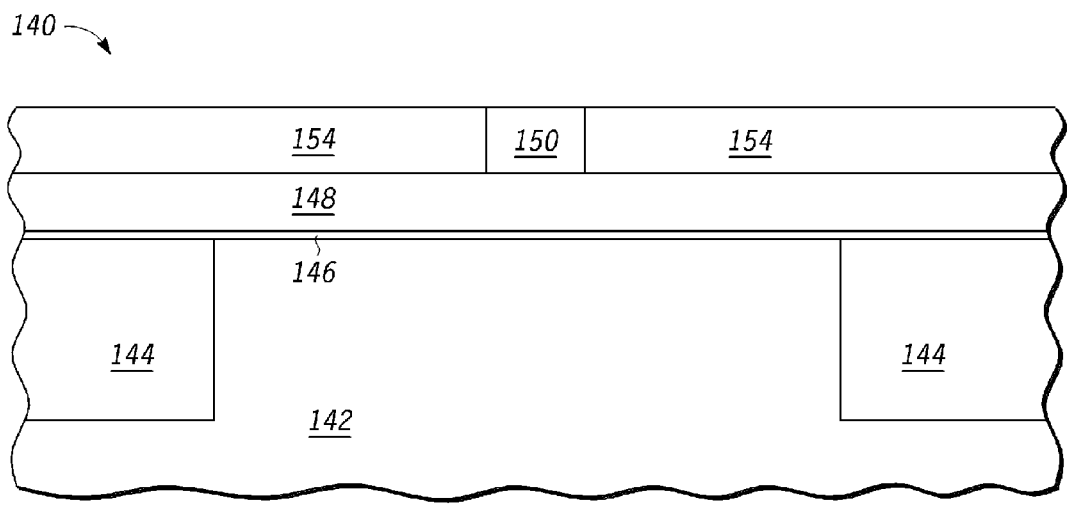
FIG. 26 is a cross section of the device structure of FIG. 25 at a stage in processing subsequent to that shown in FIG. 25.

Shown in FIG. 26 is device structure 140 after a chemical-mechanical-polishing (CMP) process has been applied to leave floating gate layer 154 with a top surface even with that of the remaining portion of sacrificial layer 150. The CMP process performed in this way results in the top surface of the remaining portion of sacrificial layer 150 being exposed.

Figure 27:
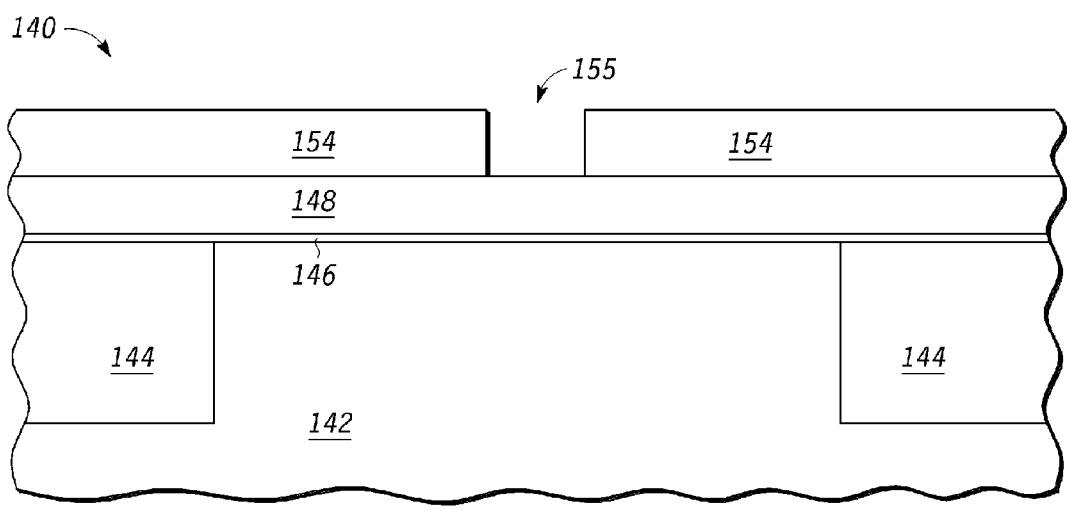
FIG. 27 is a cross section of the device structure of FIG. 26 at a stage in processing subsequent to that shown in FIG. 26.

Shown in FIG. 27 is device structure 140 after the remaining portion of sacrificial layer 150 has been removed. This leaves an opening 155 in floating gate layer 154. Opening 155 is substantially centered between isolation regions 144 in the direction shown in this cross section.

Figure 28:
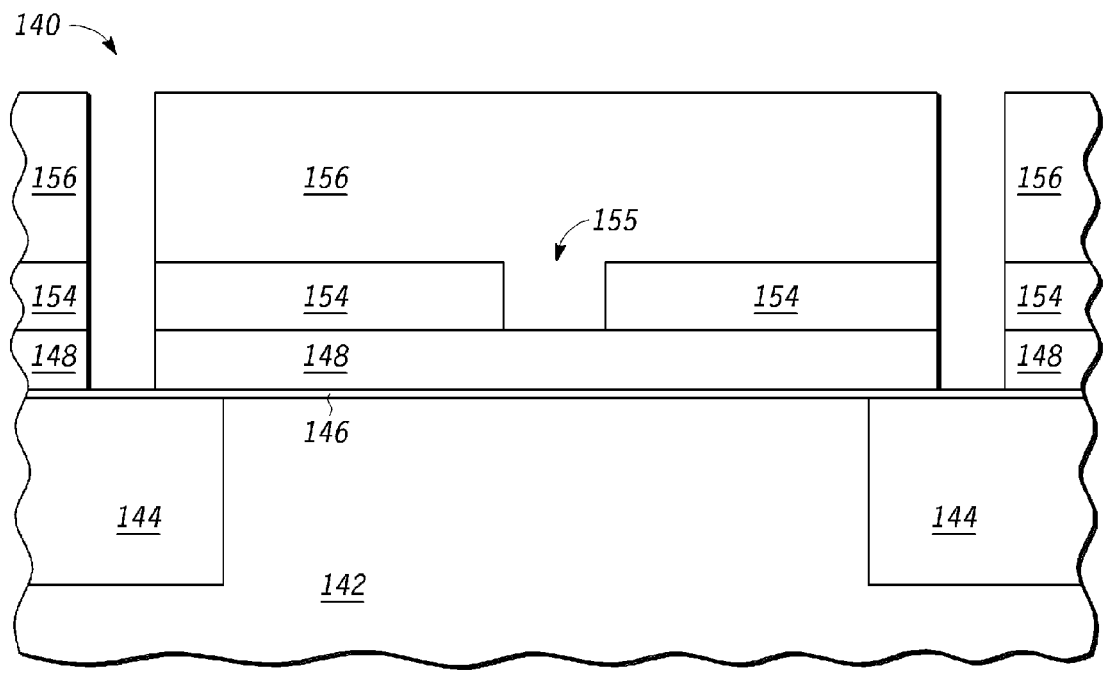
FIG. 28 is a cross section of the device structure of FIG. 27 at a stage in processing subsequent to that shown in FIG. 27.

Shown in FIG. 28 is device structure 140 after formation of a patterned photoresist layer 156 that has openings over the isolation region 144 and an etch in those openings through floating gate layer 154 and floating gate layer 148.

Figure 29:
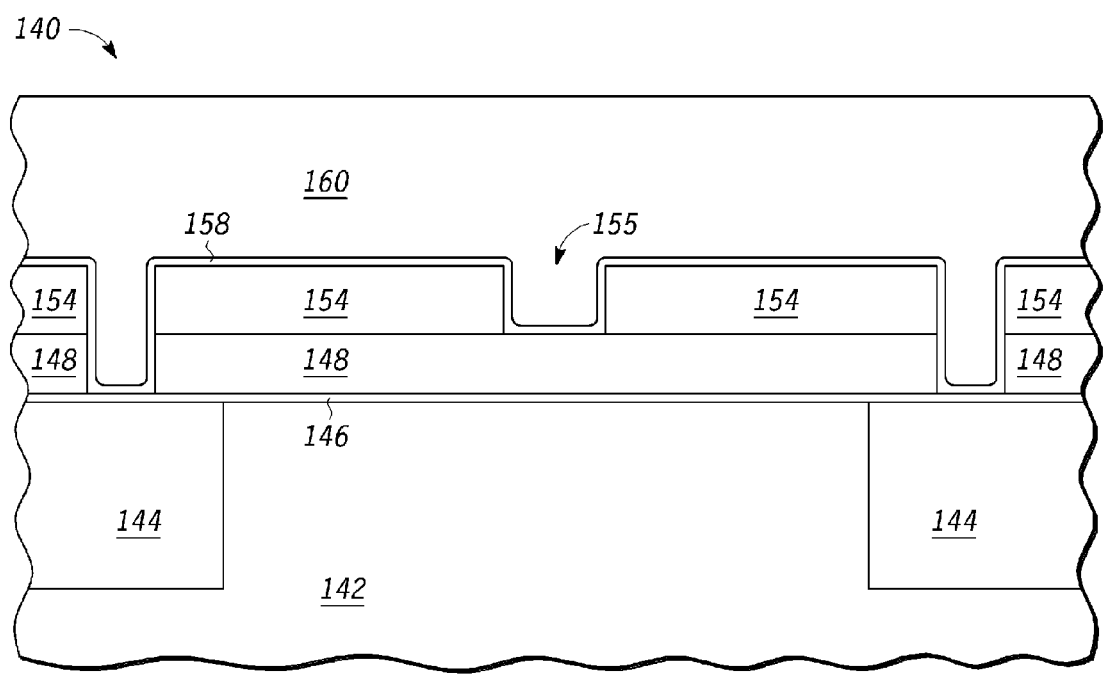
FIG. 29 is a cross section of the device structure of FIG. 28 at a stage in processing subsequent to that shown in FIG. 28.

Shown in FIG. 29 is device structure 140 after formation of dielectric layer 158 in the openings over isolation region 144 and in opening 155 and formation of control gate layer 156 160. Dielectric layer 158 is analogous to dielectric layer 36. As a cross section, FIG. 29 depicts a completed memory device having increased control gate to floating gate layer capacitance as a result of opening 155 while retaining the increased capacitance in openings over isolation region 144.

Figure 30:
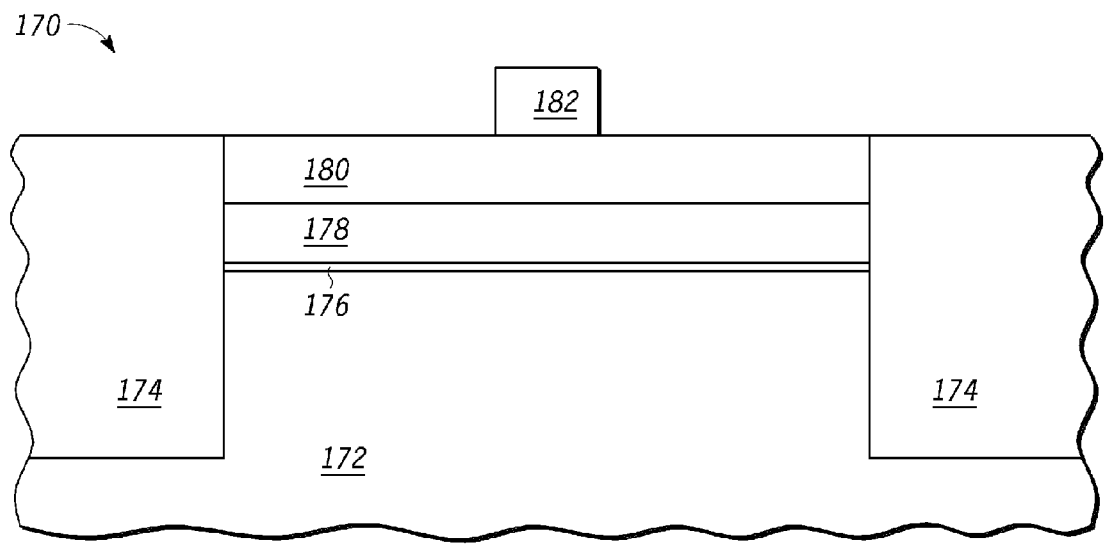
FIG. 30 is a cross section of a device structure as a sixth embodiment of the invention at a stage in processing.

Shown in FIG. 30 is a device structure 170 comprising a substrate 172 analogous to substrate 12, an isolation region 174 analogous to isolation region 54, a gate dielectric layer 176 analogous to gate dielectric layer 58, a floating gate layer 178 analogous to floating gate layer 60, a sacrificial layer 180 on floating gate layer 178, and a patterned photoresist portion 182 on sacrificial layer 180. Photoresist portion 182 is between isolation regions 174 and substantially centered in this cross sectional view. Sacrificial layer 180 is preferably oxide but could be another material such as nitride. Sacrificial layer 180 should be able to be selectively etched with respect to floating gate layer 178.

Figure 31:
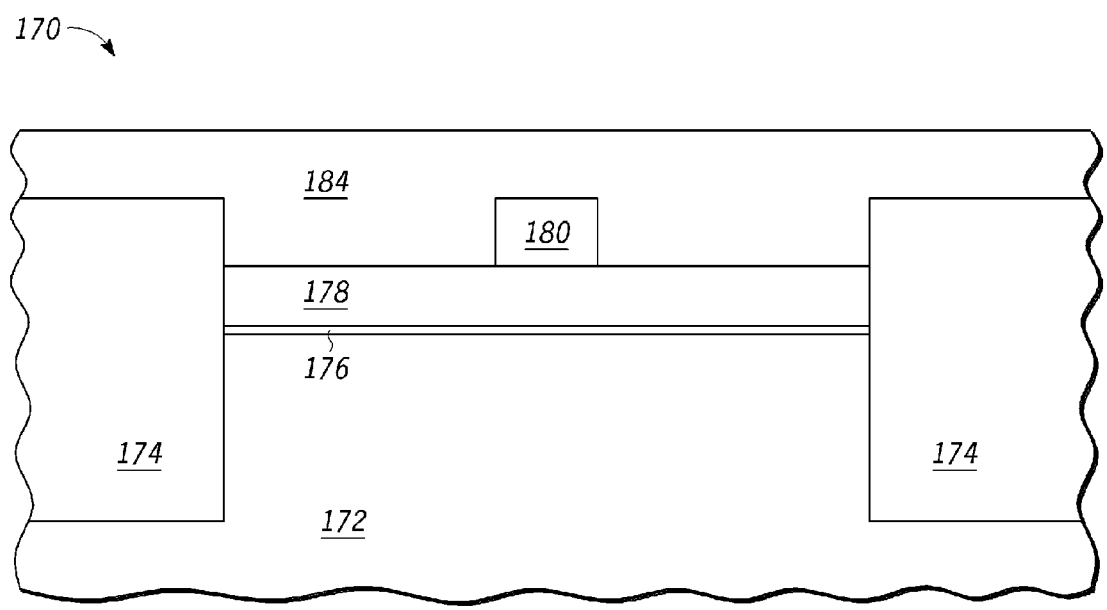
FIG. 31 is a cross section of the device structure of FIG. 30 at a stage in processing subsequent to that shown in FIG. 30.

Shown in FIG. 31 is device structure 170 after etching sacrificial layer 180 using photoresist portion 182 as a mask and formation of a floating gate layer 184 over isolation region 174, floating gate layer 178, and the remaining portion of sacrificial layer 180. Preferably floating gate layer 184 is polysilicon which deposits conformally but is shown as being planar. This is because the proximity of the sides of the remaining portion of sacrificial layer 180 and isolation region 174 has the effect of causing a conformally deposited layer to appear planar. If the proximity is greater then layer floating gate layer 184 may appear conformal, which is not a problem so long as it is sufficiently thick. It is preferably that it be as thick as the height of the remaining portion of sacrificial layer 180.

Figure 32:
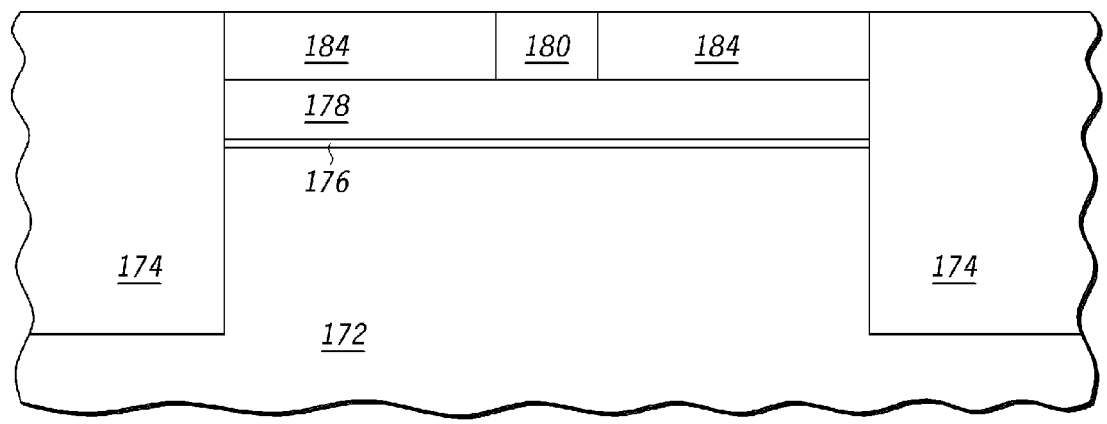
FIG. 32 is a cross section of the device structure of FIG. 31 at a stage in processing subsequent to that shown in FIG. 31.

Shown in FIG. 32 is device structure 170 after a CMP process has been applied. This results in a relatively planar surface so that the height of floating gate layer 184 is the same as the height of the remaining portion of sacrificial layer 180 and is even with the top surface of isolation region 174. This results in the top surface of the remaining portion of sacrificial layer 180 being exposed.

Figure 33:
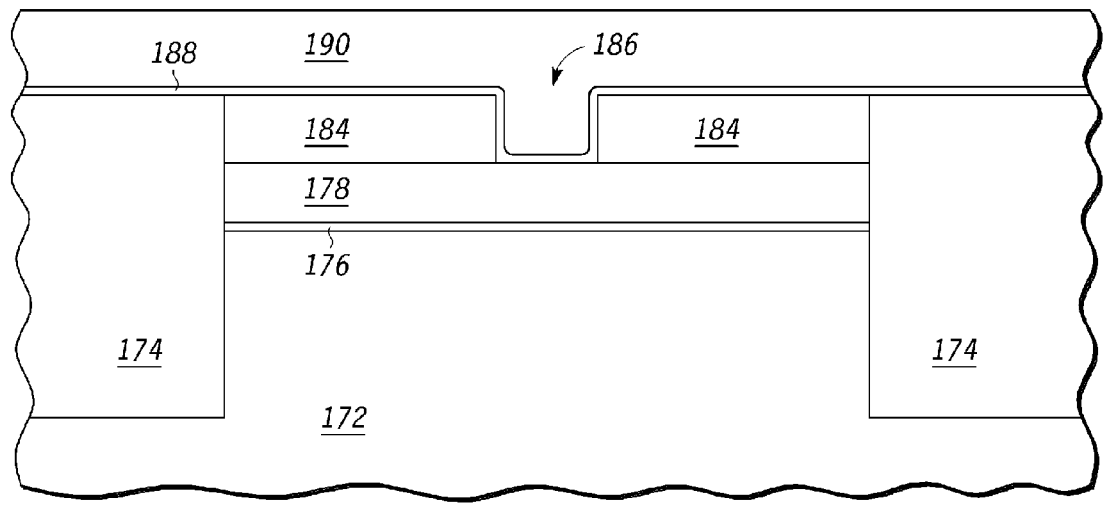
FIG. 33 is a cross section of the device structure of FIG. 32 at a stage in processing subsequent to that shown in FIG. 32.

Shown in FIG. 33 is device structure 170 after removing the remaining portion of sacrificial layer 180 to form an opening 186, formation of a dielectric layer 188 analogous to dielectric layer 36 in opening 186 and on floating gate layer 184, and formation of a control gate layer 190 analogous to control gate layer 38 on dielectric layer 188. A complete memory cell is depicted in this cross sectional view. The memory cell has increased capacitance due to control gate 190 being in opening 186.

The sidewalls of opening 186 of FIG. 33 and 155 of FIG. 29 are substantially vertical which is better for increasing capacitance using the opening. If the slope of the sidewalls of opening 186 and 155 caused opening 186 and 155 to be larger at the top than at the bottom, then there would be less added capacitance due to filling opening 186 and 155 with control gate.

In the foregoing specification, the invention has been described with reference to specific embodiments. However, one of ordinary skill in the art appreciates that various modifications and changes can be made without departing from the scope of the present invention as set forth in the claims below. For example, certain materials and thicknesses were described and these may be varied. Further, in many cases the number of features that were created to provide increased capacitance could be increased inside the isolation regions. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A floating gate device a substrate, comprising:
   a substrate;
   a gate dielectric overlying the substrate;
   a floating gate having a first floating gate portion and a second floating gate portion; wherein:
      the first floating gate portion overlies the gate dielectric, wherein the first floating gate portion is continuous;
      the second floating gate portion overlies the first floating gate portion, wherein the second floating gate portion includes a plurality of separate portions over the first floating gate portion;
      an etch stop layer between each of the plurality of separate portions of the second floating gate portion and the first floating gate portion that permits passage of charge during programming and erasing of the floating gate device;
   an interlevel dielectric overlying the separate portions of the second floating gate portion and the first floating gate portion; and
   a control gate overlying the interlevel dielectric, wherein the control gate extends down in a region between the separate portions and over the first floating gate portion.

2. A floating gate device of claim 1, wherein the substrate further comprises isolation regions, and wherein the plurality of separate portions of the second floating gate portion are between isolation regions and the region between the separate portions is between the isolation regions.

3. A floating gate device of claim 2, wherein at least one of the plurality of separate portions of the second floating gate portion is adjacent a sidewall of an isolation region.

4. A floating gate device of claim 1, wherein the etch stop layer is substantially electrically transparent between each of the plurality of separate portions of the second floating gate portion and the first floating gate portion.

5. A floating gate device of claim 1, wherein the etch stop layer has a thickness in a range of approximately 15 to 20 Angstroms.

* * * * *